(12) United States Patent
Auen

(10) Patent No.: US 9,599,319 B2
(45) Date of Patent: Mar. 21, 2017

(54) LIGHT-EMITTING DEVICE INCLUDING A SEMICONDUCTOR COMPONENT AND AN OPTICAL ELEMENT AND METHOD FOR MANUFACTURING THEREOF

(71) Applicant: OSRAM Opto Semiconductors GmbH, Regensburg (DE)

(72) Inventor: Karsten Auen, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 17 days.

(21) Appl. No.: 14/397,159

(22) PCT Filed: Apr. 17, 2013

(86) PCT No.: PCT/EP2013/058007
§ 371 (c)(1),
(2) Date: Oct. 24, 2014

(87) PCT Pub. No.: WO2013/160175
PCT Pub. Date: Oct. 31, 2013

(65) Prior Publication Data
US 2015/0117010 A1     Apr. 30, 2015

(30) Foreign Application Priority Data

Apr. 25, 2012   (DE) .................. 10 2012 103 633

(51) Int. Cl.
*F21V 17/10*     (2006.01)
*F21V 17/06*     (2006.01)
(Continued)

(52) U.S. Cl.
CPC ................ *F21V 17/06* (2013.01); *F21K 9/60* (2016.08); *F21K 9/90* (2013.01); *G02B 6/4204* (2013.01); *G02B 19/0061* (2013.01); *H01L 33/483* (2013.01); *H01L 33/58* (2013.01); *H01L 2924/0002* (2013.01); *H01S 5/02212* (2013.01); *H01S 5/02288* (2013.01); *Y10T 29/41* (2015.01)

(58) Field of Classification Search
CPC ........ F21V 17/06; F21V 5/008; F21V 17/164; F21V 17/005; F21V 19/002; F21V 17/16; F21V 17/162; F21V 17/166; F21V 17/168; F21Y 2101/02
See application file for complete search history.

(56) References Cited

U.S. PATENT DOCUMENTS

| | | |
|---|---|---|
| 4,704,669 A | 11/1987 | Brunner |
| 4,890,296 A | 12/1989 | Crosby |

(Continued)

FOREIGN PATENT DOCUMENTS

| | | | | |
|---|---|---|---|---|
| AT | CA 2259750 A1 | * | 7/1999 | ............ B61L 5/1836 |
| CN | 1054334 A | | 9/1991 | |

(Continued)

*Primary Examiner* — Robert May
(74) *Attorney, Agent, or Firm* — Slater Matsil, LLP

(57) ABSTRACT

A radiation-emitting device and a method for producing a radiation-emitting device are disclosed. In an embodiment, a radiation-emitting device comprises an optoelectronic semiconductor component and an optical element disposed downstream of the semiconductor component in an emission direction. The optical element is mechanically fixed to the semiconductor component by a clamp.

7 Claims, 3 Drawing Sheets

(51) Int. Cl.
*G02B 6/42* (2006.01)
*H01L 33/48* (2010.01)
*H01L 33/58* (2010.01)
*G02B 19/00* (2006.01)
*F21K 99/00* (2016.01)
*H01S 5/022* (2006.01)

(56) References Cited

U.S. PATENT DOCUMENTS

| | | | |
|---|---|---|---|
| 4,959,761 A | 9/1990 | Critelli et al. | |
| 5,394,430 A | 2/1995 | Huang | |
| 5,546,490 A | 8/1996 | Kikuchi et al. | |
| 5,595,435 A * | 1/1997 | Palmer | F21L 4/04 362/109 |
| 5,615,052 A | 3/1997 | Doggett | |
| 6,998,650 B1 | 2/2006 | Wu | |
| 7,223,023 B2 | 5/2007 | Killer et al. | |
| 7,670,064 B2 | 3/2010 | Frenzel | |
| 7,815,339 B2 * | 10/2010 | Veenstra | F21K 9/13 362/249.02 |
| 2002/0034076 A1 * | 3/2002 | Becker | B60Q 3/0203 362/331 |
| 2006/0002114 A1 * | 1/2006 | Sun | F21K 9/00 362/257 |
| 2006/0002115 A1 * | 1/2006 | Jeong | H01J 65/046 362/260 |
| 2006/0061851 A1 | 3/2006 | Takahashi et al. | |
| 2006/0203476 A1 * | 9/2006 | Chapman | F21L 4/027 362/157 |
| 2008/0130275 A1 | 6/2008 | Higley et al. | |
| 2010/0002450 A1 | 1/2010 | Pachler et al. | |

FOREIGN PATENT DOCUMENTS

| | | | |
|---|---|---|---|
| CN | 2664240 Y | 12/2004 | |
| CN | 102278713 A | 12/2011 | |
| DE | 3630807 A1 | 3/1987 | |
| DE | 69000387 T2 | 4/1993 | |
| DE | 10344767 A1 | 5/2005 | |
| DE | 102007038787 A1 * | 2/2009 | F21K 9/00 |
| EP | 0592746 A1 | 4/1994 | |
| EP | 1480063 A2 | 11/2004 | |
| WO | 2010150653 A1 | 12/2010 | |
| WO | 2011154310 A1 | 12/2011 | |

* cited by examiner

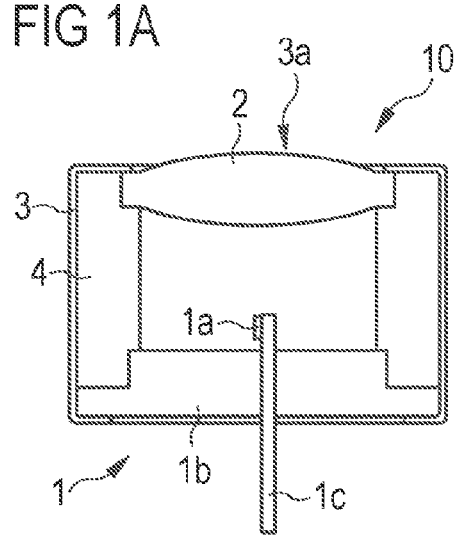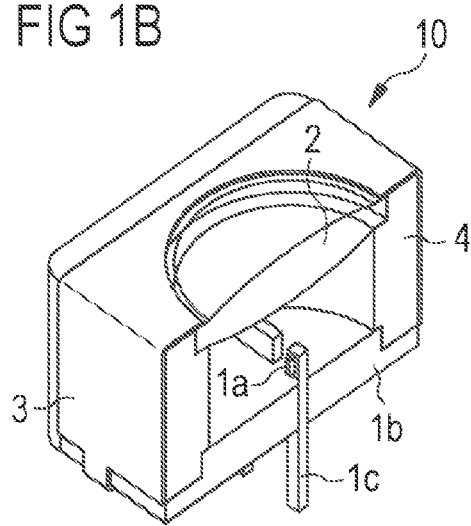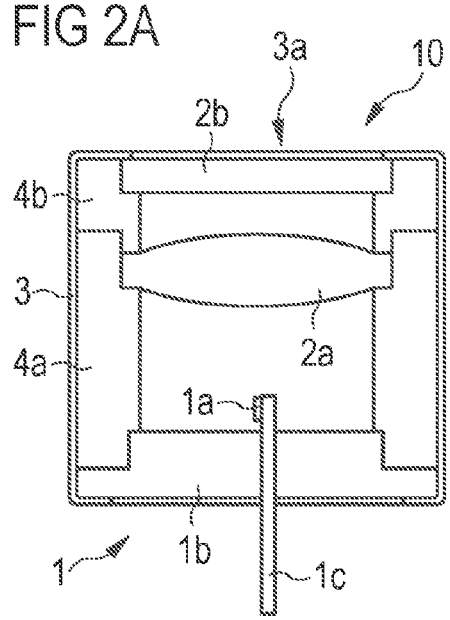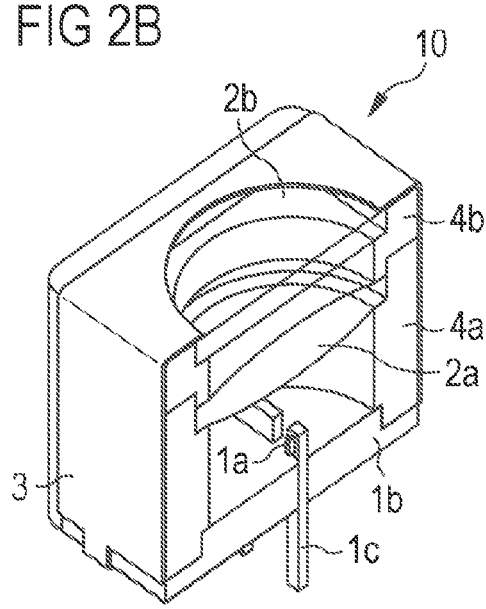

1

LIGHT-EMITTING DEVICE INCLUDING A SEMICONDUCTOR COMPONENT AND AN OPTICAL ELEMENT AND METHOD FOR MANUFACTURING THEREOF

This patent application is a national phase filing under section 371 of PCT/EP2013/058007, filed Apr. 17, 2013, which claims the priority of German patent application 10 2012 103 633.0, filed Apr. 25, 2012, each of which is incorporated herein by reference in its entirety.

TECHNICAL FIELD

The present invention relates to a radiation-emitting device comprising a semiconductor component and an optical element. The present invention furthermore relates to a method for producing such a device.

BACKGROUND

In a combination of optoelectronic semiconductor components with downstream optical elements, such as lenses or filters, for example, different materials of the individual component parts are used, such as plastics and metals, for example. Adhesives that reliably connect these different materials under extreme environmental conditions such as, for example, under extreme temperatures and/or moisture are not always available in this case. In particular, different coefficients of thermal expansion of the different materials of the individual component parts can load the adhesive-containing connection. Moreover, outgassings from the adhesives can adversely influence the lifetime of such a device and/or of the individual component parts of the device. Even during the process of joining together the different component parts, damage to the individual component parts can occur on account of specific sensitivities of said component parts. By way of example, component parts composed of plastic are sensitive to high temperatures.

Possible processes for joining different component parts include, inter alia, processes of adhesive bonding with the disadvantages mentioned above and also welding such as, for example, ultrasonic welding in the case of plastic components. As an alternative to connecting a plurality or two component parts of a device, a press-fit with the correspondingly required close tolerances of the individual component parts is possible.

SUMMARY

Embodiments of the present invention specify a device which is distinguished by an alternative connection of two or more component parts of the device. Further embodiments of the present invention specify a simplified or improved method for producing such a device.

In accordance with at least one embodiment, the radiation-emitting device comprises an optoelectronic semiconductor component and at least one optical element. The optical element is disposed downstream of the semiconductor component in the emission direction. In addition, the optical element is mechanically fixed to the semiconductor component by a clamp.

The semiconductor component is preferably a radiation-emitting component having an emission direction. This means, in particular, that the semiconductor component emits the majority of the generated radiation in one direction. In this direction, the optical element is disposed downstream of the semiconductor component, such that the radiation emitted by the semiconductor component passes through the optical element before it leaves the device.

An optical element should be understood to mean, in particular, any element that is suitable for influencing the radiation emitted by the semiconductor component. By way of example, the optical element is suitable for changing or deflecting the radiation direction of the radiation emitted by the component. Alternatively or additionally, the optical element can influence the wavelength of the radiation emitted by the component. By way of example, the optical element is a lens, a filter, a conversion element and/or a diffuser element.

The optical element and the semiconductor component are mechanically connected to one another by the clamp. By way of example, the optical element is mounted on the semiconductor component by the clamp. Advantageously, the component parts of the device, that is to say the optical element and the semiconductor component, can thereby be connected to one another by a single process step by the placement of the clamp. Adhesives for connecting the individual component parts are thus advantageously not required, with the result that extreme environmental conditions such as, for example, extreme temperatures and moisture have no influence on the quality of the connection of the component parts of the device. Further process steps such as, for example, soldering the device onto a printed circuit board also do not adversely affect the quality of the connection of the individual component parts.

Advantageously, by the clamp, it is possible to ensure a connection of the individual component parts of the device, in the case of which component parts different materials are not rigidly connected to one another, with the result that strains and, in the extreme case, the release of the connection do not occur in the case where the component parts have different coefficients of thermal expansion. Advantageously, in contrast to adhesive-bonding connections, for example, the connection by the clamp can be effected without complicated process controls. A control of, for example, the amount of adhesive or curing conditions of the adhesive-bonding connection, such that a reliable connection can be ensured, is advantageously not absolutely necessary in the present case. It is furthermore advantageous that the clamp can be removed without any residues, with the result that possible rework processes can be carried out in a simplified manner.

A clamp should be understood to mean, in particular, a mechanical fixing or connecting element which connects two or more component parts to one another by clamping. By way of example, for this purpose, the clamp is embodied in a substantially U-shaped fashion, the individual component parts being clamped in between the U-shape, as a result of which a mechanically releasable connection is produced. The clamp is preferably formed from spring steel.

The semiconductor component is an optoelectronic component which makes it possible to convert electrically generated data or energies into light emission, or vice versa. The semiconductor component comprises at least one optoelectronic semiconductor chip, preferably a radiation-emitting semiconductor chip. The semiconductor chip is preferably an LED (light-emitting diode) or a laser diode.

The semiconductor component can comprise further component parts, such as, for example, a housing or a carrier substrate, on which the semiconductor chip is electrically and mechanically mounted. The housing is a premold housing, for example, in which a leadframe for making electrical contact with the semiconductor chip is integrated.

The semiconductor chip of the semiconductor component has a semiconductor layer stack containing an active layer for generating radiation. For this purpose, the active layer preferably contains a pn junction, a double heterostructure, a single quantum well (SQW) structure or a multi quantum well (MQW) structure for generating radiation. In this case, the designation quantum well structure does not exhibit any significance with regard to the dimensionality of the quantization. It encompasses, inter alia, quantum wells, quantum wires and quantum dots and any combination of these structures.

The semiconductor layer stack of the semiconductor chip preferably contains a III/V semiconductor material. III/V semiconductor materials are particularly suitable in particular for generating radiation in the ultraviolet through the visible right into the infrared spectral range.

In accordance with at least one embodiment, a carrier is arranged between the semiconductor component and the optical element, said carrier being mechanically fixed to the semiconductor component together with the optical element by the clamp. The carrier accordingly serves as a carrier for the optical element. In this case, the optical element is connected to the semiconductor component, for example to the housing of the semiconductor component, together with the carrier by the clamp. In this case, the carrier is preferably embodied in such a way that a desired distance between semiconductor component and optical element is produced. The desired distance is dependent, for example, on the emission characteristic of the semiconductor component and on the optical effect of the optical element.

For the purpose of connecting the semiconductor component, the optical element and the carrier, the clamp is preferably guided around all three component parts and links them together with one another, thereby giving rise to a mechanical fixing or connection of these three component parts. By way of example, for this purpose, the clamp is guided at lateral regions of the optical element, of the carrier and of the semiconductor component and hooks under both at an opposite side of the semiconductor component relative to the optical element and at an opposite side of the optical element relative to the semiconductor component.

In accordance with at least one embodiment, the clamp is hooked under for fixing purposes at least on an opposite side of the semiconductor component relative to the optical element. In other words, the clamp is guided at least laterally with respect to the semiconductor component and at least in regions on the opposite side of the semiconductor component relative to the optical element. Preferably, such a guidance is also provided on the part of the optical element, such that the clamp is additionally guided at an opposite side of the optical element relative to the semiconductor component and at a lateral region of the optical element. This enables a mechanical fixing of the individual component parts between the hooked-under regions of the clamp.

In accordance with at least one embodiment, the clamp has an opening for the emergence of radiation in the emission direction of the semiconductor component. What can advantageously be ensured by the opening is that the clamp does not or at least does not appreciably influence the emission characteristic of the device. In this case, the radiation emitted by the semiconductor component and passing through the optical element can advantageously emerge through the opening in the clamp without being influenced by the clamp.

In accordance with at least one embodiment, a plurality of optical elements are disposed downstream of the semiconductor component in the emission direction, said optical elements being stacked one above another and being mechanically fixed to the semiconductor component by the clamp. The device accordingly comprises a plurality of optical elements which are arranged one behind another and which are all fixed to the semiconductor component with a single clamp. With just a single process step of placing the clamp onto the component parts, as many component parts as desired can thus be connected to the semiconductor component simply and rapidly.

In this case, further carriers can be arranged between the individual optical elements. By way of example, a further carrier is placed on the carrier for the first optical element, said further carrier serving as a carrier for the second optical element and, in addition, advantageously fixing the first optical element in its position. Accordingly, the further carriers for the further component parts serve as carriers of said further component parts and respectively for fixing the adjacent lower component parts.

Alternatively, the plurality of optical elements can be arranged jointly at the semiconductor component via the carrier. In this case, the device only has one common carrier to which the optical elements are installed jointly. By way of example, for this purpose, structures are in each case provided at the optical elements, which structures in each case fix the adjacent optical element in its position.

In accordance with at least one embodiment, the carrier or carriers has or have structures for guiding the clamp. The placement of the clamp onto the optical element or optical elements, onto the carrier or carriers and/or onto the semiconductor component can advantageously be facilitated as a result. In this case, the structures are embodied in such a way that they guide the clamp, thereby ensuring the desired connection between the semiconductor component and the further component parts. In addition, said structures can be provided for spreading the clamp during placement onto the individual component parts of the device.

In accordance with at least one embodiment, at least one elastic element is arranged between at least two component parts of the device. In particular, all the component parts of the device are subject to manufacturing tolerances. Accordingly, provision is made for designing the dimensioning of the clamp to be large enough that it still ensures a mechanical fixing and connection, in particular a clamping of the individual component parts, in the case of the respectively largest tolerances of the component parts. As a result, however, an undesired mobility between the different component parts can occur in the case of the respectively smallest tolerances of the component parts. This possibly unwanted mobility can be compensated for by the elastic element. By way of example, the elastic element is an O-ring. O-rings are preferably ring-shaped sealing elements which, on account of their elastic material, can compensate for or adapt such clearances and mobilities between the component parts.

In accordance with at least one embodiment, a method for producing a radiation-emitting device comprising an optoelectronic semiconductor component and at least one optical element comprises the following method steps:

A) providing the semiconductor component,

B) disposing the optical element downstream of the semiconductor component in the emission direction, and C) mechanically fixing the optical element to the semiconductor component by a clamp.

The exemplary embodiments and advantages mentioned in connection with the device are also applied in association with the production method, and vice versa.

With the present production method, it is advantageous that as many component parts as desired can be mechanically connected to the semiconductor component by a single process step of placing the clamp. A flexible connection of the individual component parts can be ensured in this case. Environmental influences and influences from further process steps advantageously do not adversely affect the quality of the clamp connection. A complicated process control of the mechanical connection is advantageously not required. In addition, it is possible for the clamp to be removed without any residues, with the result that possible rework processes can be carried out in a simplified manner.

In accordance with at least one embodiment, before method step B), a carrier for carrying the optical element is placed onto the semiconductor component. The carrier serves, in particular, as a carrier for the optical element. In method step C), the clamp then mechanically connects the optical element, the carrier and the semiconductor component to one another.

In accordance with at least one embodiment, the clamp is placed onto the optical element from sides thereof, is guided along the carrier and/or the semiconductor component and is hooked under on the opposite side of the semiconductor component relative to the optical element. The mechanical fixing of the individual component parts of the device to one another can thereby advantageously be ensured.

In accordance with at least one embodiment, in method step B), a plurality of optical elements are disposed downstream of the semiconductor component in the emission direction. In this case, a plurality of optical component parts are stacked above the semiconductor component and are mechanically connected to one another or fixed to one another by the common clamp. Advantageously, in this case, a further carrier for a further optical element is placed on the carrier for the first optical element, said further optical element additionally fixing the first optical element in its position. Further optical elements and carriers can correspondingly be arranged and fixed above these first optical component parts.

Alternatively, the plurality of optical elements are arranged at the semiconductor component by a common carrier and fixed relative to one another.

BRIEF DESCRIPTION OF THE DRAWINGS

Further advantages and advantageous developments of the invention will become apparent from the exemplary embodiments described below in connection with FIGS. 1 to 5, in which:

FIGS. 1A, 2A, 3A, 4A, 5A in each case show a schematic cross section of an exemplary embodiment of a device according to the invention, and FIGS. 1B, 2B, 3B, 4B, 5B in each case show a schematic view of an exemplary embodiment of a device according to the invention from FIGS. 1A, 2A, 3A, 4A, 5A.

Figure 3A:
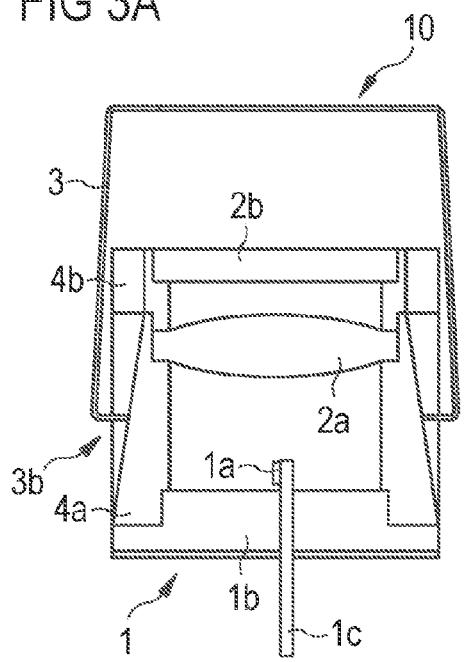

In the figures, identical or identically acting constituent parts may be provided in each case with the same reference signs. The illustrated constituent parts and their size relationships among one another should not be regarded as true to scale. Rather, individual constituent parts such as, for example, layers, structures, component parts and regions may be illustrated with exaggerated thickness or size dimensions in order to enable better illustration and/or in order to afford a better understanding.

DETAILED DESCRIPTION OF ILLUSTRATIVE EMBODIMENTS

FIG. 1A illustrates a radiation-emitting device 10 comprising an optoelectronic semiconductor component 1 and an optical element 2. The semiconductor component 1 comprises a radiation-emitting semiconductor chip 1a, a premold housing 1b and a printed circuit board for making electrical contact with the semiconductor chip. The semiconductor chip 1a is an LED or a laser, for example. The printed circuit board 1c serves for externally making electrical contact with the semiconductor chip 1a. The housing 1b encloses the printed circuit board 1c in regions. In particular, the premold housing pots the printed circuit board 1c in regions.

The optical element 2 is disposed downstream of the semiconductor component 1 in the emission direction. In particular, during operation the semiconductor chip 1a emits a radiation which, before emerging from the semiconductor component 1, passes through the optical element 2 and is influenced there. By way of example, the optical element 2 is a lens or a filter.

The optical element 2 is arranged at the housing 1b of the semiconductor component 1 by a carrier 4. The carrier 4 is placed onto the housing of the semiconductor component. In this case, the carrier 4 encloses the semiconductor chip 1a fully circumferentially. In the region of the optical element 2, the carrier 4 has a cutout, such that the radiation emitted by the semiconductor chip 1a can pass through the optical element 2, without being impeded or influenced by the carrier 4.

The optical element 2 together with the carrier 4 is connected to the housing 1b of the semiconductor component with the aid of a clamp 3. In particular, the optical element 2 is mechanically fixed to the semiconductor component 1 by the clamp 3. For mechanical fixing purposes, the clamp is placed onto the device from sides of the optical element 2 and is guided along the carrier 4 until the clamp 3 hooks under the housing 1b of the semiconductor component 1. For this purpose, the clamp is embodied in U-shaped fashion in cross section, for example, and hooks under both at the side of the optical element 2 and at the side of the semiconductor component 1 such that the individual component parts of the device 10 are arranged and thus clamped between the hooked-under regions of the clamp 3.

In the emission direction of the semiconductor component 1, the clamp has an opening 3a for the emergence of radiation. As a result, the clamp 3 advantageously does not impede the emission characteristic of the device 10. Preferably, on the part of the semiconductor component 1, too, the clamp 3 has an opening, through which the printed circuit board 1c for externally making electrical contact is guided. In this case, the clamp 3 is accordingly embodied as a hollow body having a respective opening at two opposite sides.

Advantageously in a single process step, namely with the placement of the clamp, as many component parts of the device as desired can be connected to the semiconductor component 1. Advantageously, no adhesives are used in this case, with the result that environmental conditions have no influence on the quality of the connection of the individual component parts. Further processes, such as, for example, the soldering of the device onto a printed circuit board, also do not adversely affect the quality of the connection of the component parts. In addition, the component parts of the device 10, in particular the different materials thereof, are advantageously connected to one another flexibly and non-rigidly, such that strains and, as a result, in the extreme case, release of the connection of the component parts advantageously do not occur in the case of different coefficients of thermal expansion. In addition, a complicated process control of the clamp connection of the component parts is advantageously not required. Furthermore, the clamp 3 can be removed without any residues, with the result that possible rework processes can be carried out in a simplified manner.

The clamp 3 is composed of spring steel, for example, and enables an advantageous connection of the individual component parts of the device.

FIG. 1B illustrates a transverse view of the device 10 of the exemplary embodiment in FIG. 1A. This shows that the clamp 3 surrounds or encloses the carrier 4 substantially fully circumferentially apart from the opening in the clamp in which the optical element 2 is arranged. At the housing 1b of the semiconductor component, the clamp 3 hooks under in regions, such that a mechanical connection is ensured by clamping.

For the rest, the exemplary embodiment in FIG. 1B substantially corresponds to the exemplary embodiment in FIG. 1A.

The device 10 in FIG. 2A differs from the device in FIG. 1A in that two optical elements 2a, 2b stacked one above the other are disposed downstream of the semiconductor component 1 in the emission direction. By way of example, the first optical element 2a is a lens and the second optical element 2b is a filter element.

The optical elements 2a, 2b are mechanically fixed to the semiconductor component 1 jointly by the clamp 3. Two mutually independent carriers 4a, 4b are used for this purpose. The first carrier 4a is placed on the housing 1b of the semiconductor component 1, said first carrier serving in particular as a carrier for the first optical element 2a. A second carrier 4b is placed on the first carrier 4a and on the first optical element 2a, said second carrier firstly fixing the first optical element 2a in its position and secondly serving as a carrier for the second optical element 2b. The two carriers 4a, 4b and the two optical elements 2a, 2b are mechanically connected to the semiconductor component 1 by the clamp 3, which once again hooks under the housing 1b of said semiconductor component 1.

For the rest, the exemplary embodiment in FIG. 2A substantially corresponds to the exemplary embodiment in FIG. 1A.

FIG. 2B illustrates a transverse view of the device 10 of the exemplary embodiment in FIG. 2A. This shows that the clamp 3 mechanically connects both carriers 4a, 4b and both optical elements 2a, 2b to one another by virtue of the clamp being guided jointly around the individual component parts and clamping them together. On a side of the housing 1b of the component which faces away from the optical elements 2a, 2b, the clamp is hooked under in regions, thereby enabling the mechanical connection and in particular the clamping.

For the rest, the exemplary embodiment in FIG. 2B substantially corresponds to the exemplary embodiment in FIG. 2A.

FIG. 3A shows a device 10 in the course of its production method. The device comprises a semiconductor component 1 in accordance with FIGS. 1 and 2, respectively. A first carrier 4a is placed on the housing 1b of the semiconductor component 1, said first carrier serving as a carrier for a first optical element 2a, for example a lens. A second carrier 4b is placed on said first carrier 4a and on the first optical element 2a, said second carrier serving as a carrier for a second optical element 2b, for example a filter element. For the purpose of connecting the individual component parts of the device 10, the clamp 3 is placed onto the component parts from sides of the second optical element 2b, is guided along the component parts and hooked under on the opposite side of the semiconductor component 1 relative to the optical elements 2a, 2b. This gives rise to a stack of component parts mechanically fixed to one another with the following order: semiconductor component 1, first carrier 4a, first optical element 2a, second carrier 4b, second optical element 2b. In this case, the construction of the component parts of the device 10 of the exemplary embodiment in FIG. 3A corresponds to the construction of the component parts of the device of the exemplary embodiment in FIG. 2A.

In contrast to the device of the exemplary embodiment in FIG. 2A, the device 10 of the exemplary embodiment in FIG. 3A comprises structures for guiding the clamp 3. In particular, the structures 3b are formed at side surfaces of the first and second carriers 4a, 4b. The structures 3b integrated at said carriers 4a, 4b advantageously facilitate the placement of the clamp 3 onto the device. In particular, the structures 3b serve for spreading the clamp 3 during the placement and in addition for mechanically guiding the clamp 3 in the direction of the semiconductor component 1.

In the exemplary embodiment in FIG. 3A, the clamp 3 has not yet been completely guided via the individual component parts of the device 10, but rather is currently in the method step of placing the clamp 3 onto the individual component parts of the device 10.

For the rest, the exemplary embodiment in FIG. 3A substantially corresponds to the exemplary embodiment in FIG. 2A.

Figure 3B:
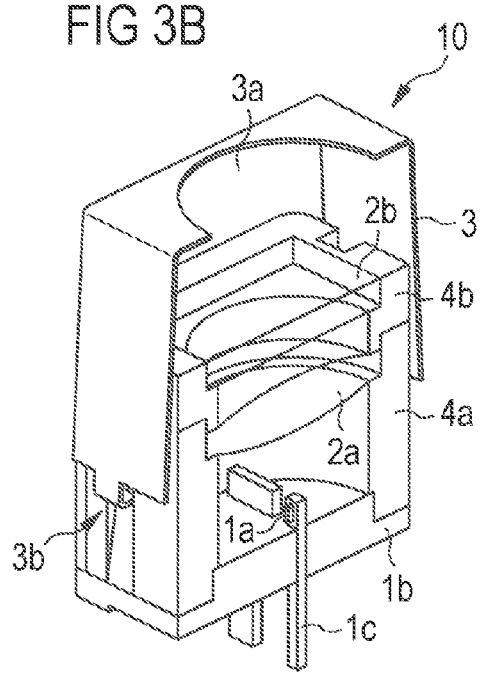

FIG. 3B illustrates a transverse view of the device 10 of the exemplary embodiment in FIG. 3A. Here, too, the clamp 3 has only partly been placed onto the component parts of the device 10 and is currently in the method step of placement in the direction of the component. The structures 3b for guiding the clamp 3 are embodied as a depression in the first carrier 4a and the second carrier 4b. In particular, a respective depression is formed at two opposite side surfaces of the carriers 4a, 4b. The depressions lead in each case along the side surfaces. The structure of the first carrier 4a here in each case merges directly into the structure of the second carrier 4b in particular without any transitions.

For the rest, the exemplary embodiment in FIG. 3B substantially corresponds to the exemplary embodiment in FIG. 3A.

Figure 4A:
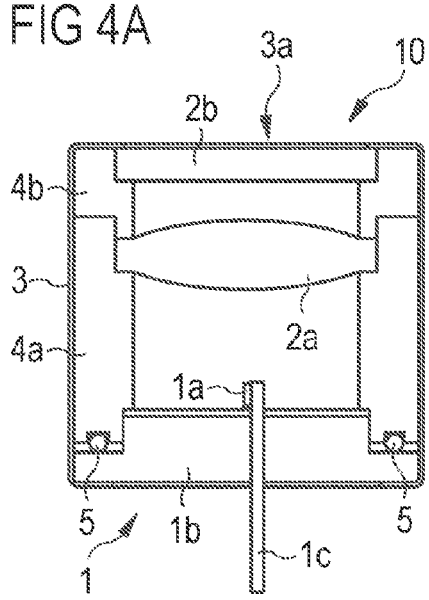

The exemplary embodiment in FIG. 4A shows a device 10 which substantially corresponds to the exemplary embodiment in FIG. 2A. In contrast to the exemplary embodiment in FIG. 2A, the device 10 in FIG. 4A comprises elastic elements 5 arranged between the semiconductor component 1, in particular the housing 1b, and the first carrier 4a. The elastic element 5 is an O-ring, for example. O-rings are ring-shaped sealing elements. On account of the relatively simple form, O-rings can easily be produced industrially. Injection molding is preferably employed for this purpose.

The elastic element 5 compensates for a clearance that can occur on account of tolerances of the individual different component parts of the device. In particular, all the component parts of the device are subject to manufacturing tolerances. Accordingly, the dimensions of the clamp 3 must be designed generously enough such that the clamp can still hook under the housing 1b of the semiconductor component 1 in the case of the respectively largest tolerances. As a result, however, said clearance can arise between the variety of different component parts in the case of the respectively smallest tolerances, said clearance being compensated for by the elastic elements 5.

In the exemplary embodiment in FIG. 4A, in particular two elastic elements 5, in particular two O-rings, are arranged between the first carrier 4a and the housing 1b, wherein the arrangement is embodied on two opposite sides of the device 10.

For the rest, the exemplary embodiment in FIG. 4A substantially corresponds to the exemplary embodiment in FIG. 2A.

Figure 4B:
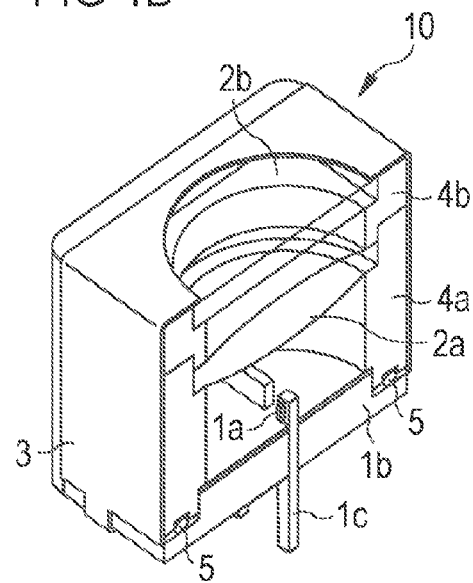

FIG. 4B illustrates a transverse view of the device in FIG. 4A. Here, too, the two opposite elastic elements 5 are shown, which are arranged between the first carrier 4a and the housing 1b of the semiconductor component.

For the rest, the exemplary embodiment in FIG. 4B substantially corresponds to the exemplary embodiment in FIG. 4A.

Figure 5A:
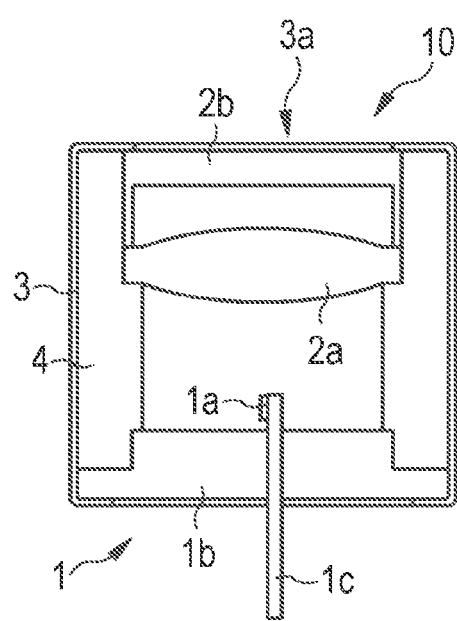

The device of the exemplary embodiment in FIG. 5A differs from the device of the exemplary embodiment in FIG. 2A in that the two optical elements 2a, 2b are installed in one carrier 4 and are placed on the semiconductor component 1. In the present case, accordingly, only one common carrier 4 is used, which carries both optical elements 2a, 2b. In order to fix the individual optical elements 2a, 2b in this case with respect to one another, structures are provided at the second optical element 2b, said structures fixing the first optical element 2a in its position. The clamp 3 mechanically fixes the two optical elements 2a, 2b and the common carrier 4 to the semiconductor component 1.

For the rest, the exemplary embodiment in FIG. 5A substantially corresponds to the exemplary embodiment in FIG. 2A.

Figure 5B:
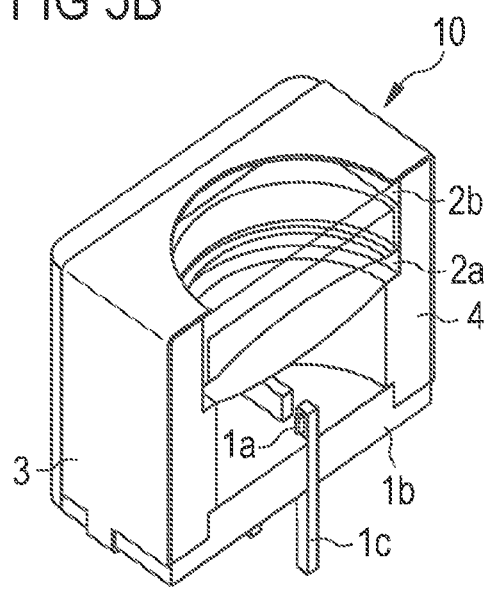

FIG. 5B illustrates a transverse view of the device 10 of the exemplary embodiment in FIG. 5A. The common carrier 4 and the two optical elements 2a, 2b, which are both jointly carried by the carrier 4, are shown in this case. The second optical element 2b in this case has connecting elements that fix the optical element 2a. The connecting elements serve, in particular, to ensure a fixed distance between the optical elements 2a, 2b.

For the rest, the exemplary embodiment in FIG. 5B substantially corresponds to the exemplary embodiment in FIG. 5A.

The invention is not restricted to the exemplary embodiments by the description on the basis of said exemplary embodiments, but rather encompasses any novel feature and also any combination of features, which in particular includes any combination of features in the patent claims, even if these features or these combinations themselves are not explicitly specified in the claims or exemplary embodiments.

The invention claimed is:
1. A radiation-emitting device comprising:
an optoelectronic semiconductor component;
a plurality of optical elements disposed downstream of the semiconductor component in an emission direction; and
a carrier comprising structures for guiding a clamp,
wherein the optical elements are mechanically fixed to the semiconductor component by the clamp,
wherein the clamp is hooked under the semiconductor component on an opposite side relative to the optical elements thereby fixing the clamp to the semiconductor component,
wherein the clamp hooks under at an opposite side of the optical elements relative to the semiconductor component,
wherein the carrier is arranged between the semiconductor component and the optical elements, the carrier being mechanically fixed to the semiconductor component together with the optical elements by the clamp,
wherein the plurality of optical elements is stacked one above another and is mechanically fixed to the semiconductor component by the clamp,
wherein the carrier comprises a plurality of carriers, and
wherein the plurality of carriers and the plurality of optical elements are stacked alternatingly.

2. The device according to claim 1, wherein the plurality of optical elements is arranged jointly at the semiconductor component via the carrier.

3. The device according to claim 1, further comprising an elastic element arranged between the carrier and the semiconductor component.

4. The device according to claim 3, wherein the elastic element comprises an O-ring.

5. The device according to claim 1, wherein the structures additionally spread the clamp.

6. The device according to claim 1, wherein the clamp has an opening for an emergence of radiation in the emission direction of the semiconductor component.

7. A radiation-emitting device comprising:
an optoelectronic semiconductor component;
a plurality of optical elements disposed downstream of the semiconductor component in an emission direction;
a carrier comprising structures for guiding a clamp; and
an elastic element arranged between the carrier and the semiconductor component, wherein the elastic element comprises an O-ring,
wherein the optical elements are mechanically fixed to the semiconductor component by the clamp,
wherein the clamp is hooked under the semiconductor component on an opposite side relative to the optical elements thereby fixing the clamp to the semiconductor component, and
wherein the clamp hooks under at an opposite side of the optical elements relative to the semiconductor component.

* * * * *